United States Patent
Reynes et al.

(10) Patent No.: US 8,188,539 B2
(45) Date of Patent: May 29, 2012

(54) FIELD-EFFECT SEMICONDUCTOR DEVICE AND METHOD OF FORMING THE SAME

(75) Inventors: Jean-Michel Reynes, Pompertuzat (FR); Isabelle Majoral, Ramonville (FR); Jean-Pierre Pujo, Frouzins (FR); Evgueniy Stefanov, Vieille Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 473 days.

(21) Appl. No.: 12/063,424

(22) PCT Filed: Aug. 10, 2005

(86) PCT No.: PCT/EP2005/009988
§ 371 (c)(1),
(2), (4) Date: Mar. 9, 2010

(87) PCT Pub. No.: WO2007/016966
PCT Pub. Date: Feb. 15, 2007

(65) Prior Publication Data
US 2010/0155828 A1    Jun. 24, 2010

(51) Int. Cl.
*H01L 29/78* (2006.01)
(52) U.S. Cl. .................. 257/339; 257/341; 257/E29.008
(58) Field of Classification Search .................. 257/328, 257/329, 331, 332, 339, E29.008
See application file for complete search history.

(56) References Cited

U.S. PATENT DOCUMENTS

| | | | |
|---|---|---|---|
| 4,680,604 A * | 7/1987 | Nakagawa et al. | 257/142 |
| 4,809,047 A | 2/1989 | Temple | |
| 5,268,586 A | 12/1993 | Mukherjee et al. | |
| 5,374,571 A | 12/1994 | Mukherjee et al. | |
| 5,897,355 A * | 4/1999 | Bulucea et al. | 438/273 |
| 5,923,065 A | 7/1999 | So et al. | |
| 6,111,278 A * | 8/2000 | Kim | 257/144 |
| 6,121,089 A | 9/2000 | Zeng et al. | |
| 6,391,723 B1 | 5/2002 | Frisina | |
| 6,495,871 B2 * | 12/2002 | Hattori et al. | 257/279 |
| 7,701,001 B2 * | 4/2010 | Jianjun et al. | 257/330 |
| 2007/0048952 A1 * | 3/2007 | Hu et al. | 438/301 |

FOREIGN PATENT DOCUMENTS

| | | |
|---|---|---|
| JP | 60186068 A | 2/1986 |
| WO | 9607200 A | 3/1996 |

* cited by examiner

*Primary Examiner* — Jerome Jackson, Jr.
*Assistant Examiner* — Paul Budd

(57) ABSTRACT

A semiconductor device comprises a semiconductor layer, a body region of a first conductivity type formed in the semiconductor layer and extending from a first surface of the semiconductor layer, a first region of a second conductivity type formed in the body region, and a second region of the first conductivity type formed in the body region. The first region extends from the first surface of the semiconductor layer and provides a current electrode region of the semiconductor device. The second region surrounds the first region. The doping concentration of the first conductivity type in the second region is greater than a doping concentration of the first conductivity type in the body region.

20 Claims, 6 Drawing Sheets

FIELD-EFFECT SEMICONDUCTOR DEVICE AND METHOD OF FORMING THE SAME

FIELD OF THE INVENTION

This invention relates to semiconductor devices and methods of forming a semiconductor device.

BACKGROUND OF THE INVENTION

Semiconductor devices such as Metal Oxide Semiconductor Field Effect Transistors (MOSFETs) are commonly used as power devices in applications, such as automotive electronics, power supplies, telecommunications, which applications require devices to operate at currents in the range of tenths up to hundreds of amperes (A).

Conventionally, by applying a voltage to the gate electrode of a MOSFET device, a channel will be formed connecting the source and the drain regions allowing a current to flow. Once the MOSFET device is turned on, the relation between the current and the voltage is nearly linear which means that the device behaves like a resistance. The resistance is referred to as the on-state resistance Rdson.

Typically, MOSFET devices with low on-state resistance Rdson are preferred as they have higher current capability. It is well known that the on-state resistance Rdson may be decreased by increasing the packing density of a MOSFET device i.e. the number of base cells per $cm^2$. For example, a hexagonal MOSFET (HEXFET) device comprises a plurality of cells, each cell having a source region and a hexagonal polysilicon gate, and has a high packing density e.g. $10^5$ hexagonal cells per $cm^2$. Due to the large number of cells and the aspect ratio which may be defined as the ratio between the length of the hexagonal perimeter of the source region and the area of the unit cell, the on-state resistance of a HEXFET device can be made very low. Usually, the smaller the size of the cells, the higher is the packing density and thus, the smaller the on-state resistance. Therefore, many improvements to MOSFET devices are aimed at reducing the size of the cells.

However, as the size of the cells are reduced and the packing density increased, the breakdown voltage of the MOSFET devices are decreased. There is therefore a trade-off between reducing Rdson and having a high enough break down voltage BVdss.

As the cell size is reduced, the channel length is reduced until a limit is reached when the depletion layer width of the body region becomes comparable to the channel length causing punch-through current at high drain biases which impacts the break down voltage BVdss and causes degradation to the threshold voltage. In other words, as the channel length is reduced to a critical limit, short-channel effects arise which complicate device operation and degrade device performance, such as reduced threshold and breakdown voltage. There is therefore a limit below which the cell size cannot be reduced or improvements need to be made to eliminate or minimise the short-channel effects.

Also, as the breakdown voltage BVdss is lowered the unclamped inductive switching (UIS) capability is also lowered. UIS behaviour is associated with a parasitic bipolar transistor phenomenon which appears in the source body drain structure when the voltage on the drain is sufficiently high. A device with lower UIS capability has a larger resistance at the base of the parasitic bipolar transistor and an increased risk of transistor failure during momentary overloads. It is therefore common practice to measure the ruggedness of a MOSFET device by characterising its UIS behaviour.

There is therefore a need for an improved semiconductor device that has reduced Rdson while not degrading its breakdown voltage, threshold voltage or high energy capability (UIS).

SUMMARY OF THE INVENTION

In accordance with a first aspect of the present invention, there is provided a semiconductor device in accordance with claim 1 of the accompanying claims.

In accordance with a second aspect of the present invention, there is provided a method of forming a semiconductor device in accordance with claim 7 of the accompanying claims.

BRIEF DESCRIPTION OF THE DRAWINGS

A semiconductor device and a method of forming a semiconductor device in accordance with the present invention will now be described, by way of example only, with reference to the accompanying drawings in which.

DETAILED DESCRIPTION OF THE PREFERRED EMBODIMENTS

In the description that follows and in FIGS. 1-11, certain regions are identified as being of a particular material, conductivity and/or type. However, this is merely for convenience of explanation and not intended to be limiting. Those of skill in the art will understand based on the description given herein that various semiconductor materials can be used and that the doping of various regions of the device may be altered in order to obtain different device functions.

The present invention will be described with reference to a semiconductor device comprising a N-channel vertical MOSFET device. It will be appreciated that the invention is not limited to a N-channel vertical device and applies equally to other semiconductor devices, such as P-channel vertical MOSFET devices or P- or N-channel lateral MOSFET devices or insulated gate bipolar transistor (IGBT) devices, JFETs or similar devices.

Figure 1:
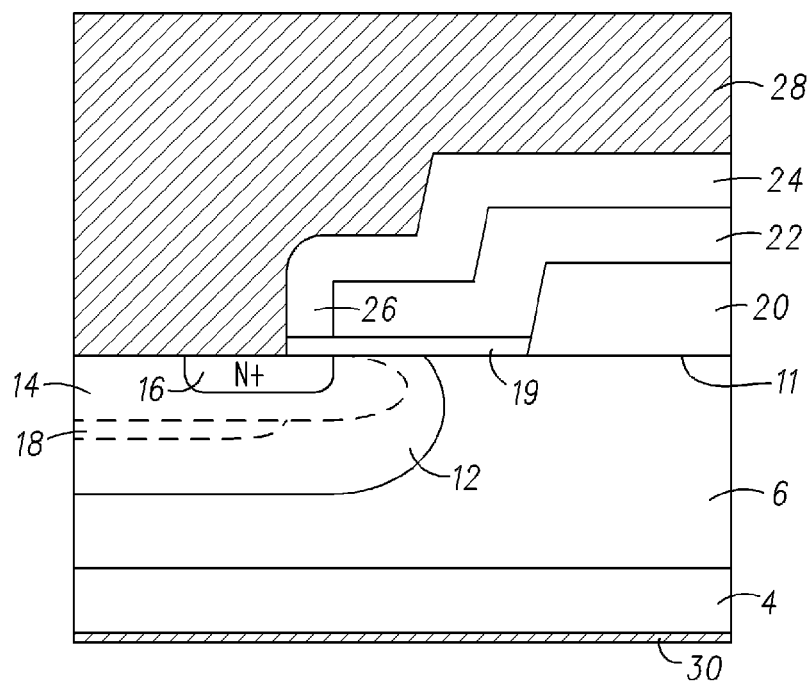
FIG. 1 is a schematic cross-section diagram of a portion of a semiconductor device in accordance with the present invention.

Referring now to FIG. 1, a MOSFET device in accordance with a preferred embodiment of the invention comprises a n-type semiconductor substrate 4 having a first surface and a second surface. A n-type epitaxial layer 6 is formed over the first surface of the semiconductor substrate 4. The doping concentration of the epitaxial layer 6 is less than the doping concentration of the semiconductor substrate 4.

A p-type body region 12 extends from a first surface 11 of the epitaxial layer 6 through the epitaxial layer 6 typically to a depth of 1.5 microns. A p-type protection region 14 extends from the first surface 11 of the epitaxial layer 6 into the body region 12 typically to a depth of 0.3 microns. A n-type region 16 extends from the first surface 11 of the epitaxial layer 6 into the p-type protection region 14 such that the p-type protection region 14 surrounds (i.e. goes around and underneath) the n-type region 16 up to the first surface 11 of the epitaxial layer 6. The n-type region 16 is the current electrode region of the semiconductor device. In the preferred embodiment, the n-type region 16 is the source region 16 of the MOSFET device. In the embodiment shown in FIG. 1, semiconductor substrate 4 forms the drain of the device. An additional p-type region 18 extends below the p-type protection region 14 into the body region 12.

The doping concentrations of the p-type protection region 14 and p-type body region 12 are arranged to provide a graded doping profile, both laterally and vertically, in the channel of the MOSFET device which extends between the source region 16 and the drain. The doping concentration is arranged to be greater adjacent the source region 16 compared to further along the channel towards the drain by a factor in the range of 2 to 3. For example, at the first surface 11 of the epitaxial layer 6, the p-type body region 12 has a peak doping concentration of about 7e17 cm$^{-3}$, the p-type protection region 14 has a maximum doping concentration of about 2e18 cm$^{-3}$ and the p-type region 18 has a doping concentration of about 1e20 cm$^{-3}$.

A field oxide layer 20 extends over the first surface 11 of the epitaxial layer 6 and a gate oxide layer 19 extends over the first surface 11 of the epitaxial layer 6 over body region 12, protection region 14 and a portion of source region 16. Gate oxide layer 19 typically comprises a silicon oxide layer having a thickness of 0.7 microns depending on the operating voltage. An insulated gate region 22 is formed over gate oxide layer 19 and field oxide layer 20 and typically comprises a doped polycrystalline semiconductor material such as polysilicon. A dielectric layer 24 is formed over the insulated gate region 22. The dielectric layer 24 may comprise a silicon oxide or TEOS layer or may comprise several layers, such as oxide/nitride/oxide layers.

A metal or ohmic layer 28 is formed over the dielectric layer 24 and contacts the source region 16 to form the source electrode. A spacer 26 isolates the metal layer 28 from the insulated gate region 22.

A metal or ohmic layer 30 is formed over the second surface of the semiconductor substrate 4 to form the drain electrode.

In operation of the MOSFET in accordance with the present invention, a channel will be formed connecting the source region 16 to the drain (substrate 4) allowing a current to flow. The protection region 14 surrounds the source region 16 and since it has a higher doping concentration than the body region 12, more p charge carriers are provided immediately around the edge of the source region 16. This ensures that the potential barrier at the junction of the source region 16 is increased when a current flows compared to the known arrangements which do not have the protection region 14 surrounding the source region 16. As the potential barrier is increased at the source junction, the electric field between the source region 16 and the drain is reduced, and thus, the voltage capability i.e. the breakdown voltage BVdss is increased.

Figure 2:
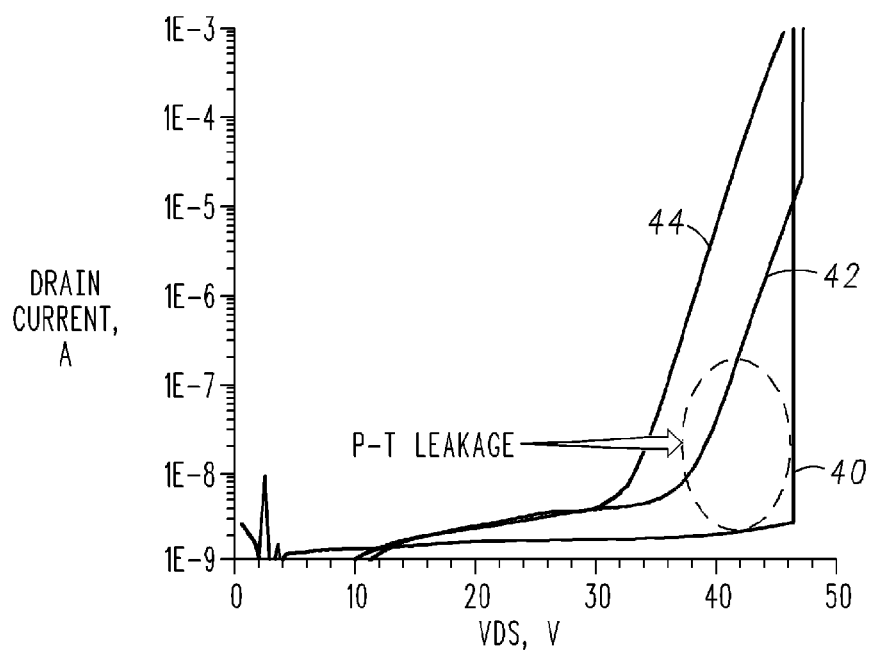
FIG. 2 is a graph showing the drain current versus drain-source voltage characteristics of different semiconductor devices.

FIG. 2 shows the measured impact of the protection region 14 on the drain current Id and the drain-source voltage Vds characteristics of the MOSFET. Curve 40 corresponds to when the protection region 14 has a doping dose of 5e13 cm$^{-2}$, curve 42 corresponds to when the protection region 14 has a doping dose of 1e13 cm$^{-2}$ and curve 44 corresponds to the case without a protection region 14. For the devices represented by curves 42 and 44, due to the punch-through leakage current, the 'real' breakdown voltage is not reached. For devices represented by curve 40, when the drain-source voltage of the MOSFET reaches the breakdown voltage, BVdss, as the potential barrier is increased within the body region 12 close to the junction of the source region, breakdown occurs across the whole body region 12 and not just at the edge of the channel at the source region 16. This means that the protection region 14 suppresses the punch-through leakage current and a perfect breakdown voltage reaction is achieved, as can be seen by curve 40. FIG. 2 also shows that the breakdown voltage is increased as the doping dose of the protection region 14 is increased.

The additional protection region 14 surrounding the source region 16 increases the doping profile under the source region 16 (i.e. at the beginning of the channel). This results in an increase in the threshold voltage. As will be discussed below, a low thermal operation and short drive is used to drive the source region 16, and protection region 14 into the epitaxial layer 6 which ensures that the amount of p charge carriers in the protection region is well controlled. Thus, since the threshold voltage can be well controlled, the cell size can be significantly reduced without degrading the threshold voltage.

Thus, as the cell size is scaled down, the protection region 14 eliminates or significantly reduces the short-channel effects, such as induced punch-through leakage at high drain biases, threshold voltage degradation and breakdown voltage lowering due to the fact that the protection region 14 reduces the electric field at the junction of the source region 16. Thus, the MOSFET device in accordance with the present invention may be scaled down in order to reduce the on-state resistance without degrading the device performance.

Figure 3:
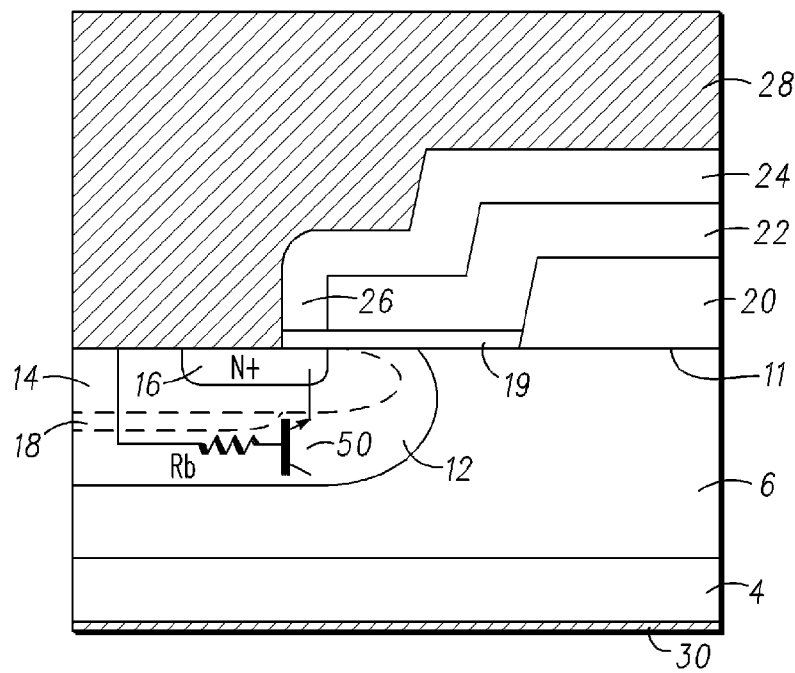
FIG. 3 is a schematic cross-section diagram of the portion of a semiconductor device as shown in FIG. 1 showing the parasitic bipolar transistor that appears at certain voltages.

FIG. 3 shows the parasitic bipolar transistor 50 having a body resistance Rb that appears in the source body drain structure when the drain voltage is sufficiently high e.g. a temporary overload situation. Note, the additional p-type region 18 is included to improve the contact resistance and to avoid the parasitic bipolar transistor being turned on. However, this only works if there are no parasitic short channel effects which as explained above appear as the cell size is reduced beyond a limit. The protection region 14 of the MOSFET device in accordance with the present invention ensures that additional p charge carriers are provided at the junction with the source region 16 (i.e. at the beginning of the channel) which reduces significantly the body resistance Rb of the parasitic bipolar transistor 50 all along the body region 12 and hence ensures improved control of the potential of the body region 12 and the MOSFET device's energy capability during UIS operation as the cell size is reduced. The body resistance Rb can be reduced by up to a factor 3 in the body region 12 around the source region 16.

A method of forming a semiconductor device in accordance with a preferred embodiment of the present invention will now be described with reference to FIGS. 1-7.

Figure 4:
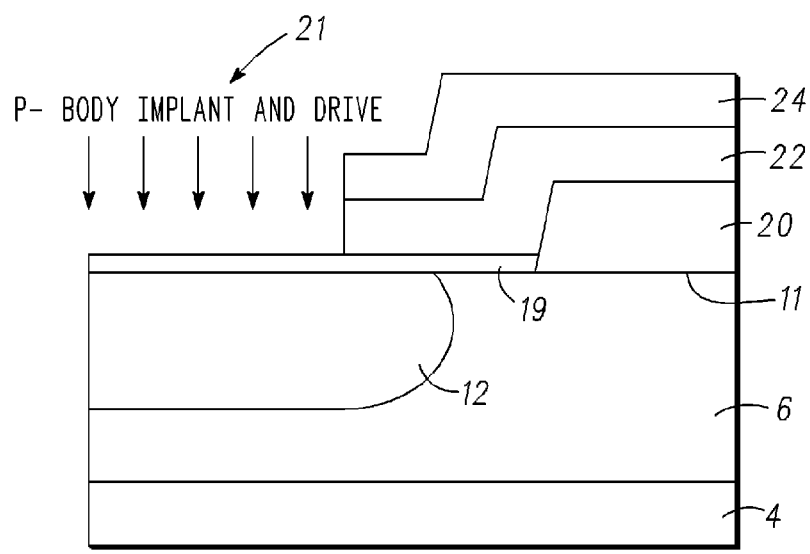
FIGS. 4-7 are schematic cross-section diagrams of the semiconductor device of FIG. 1 during different stages of fabrication in accordance with a first embodiment.

As shown in FIG. 4, an n-type epitaxial layer 6 is grown on an n-type substrate 4. The doping concentration of the n-type substrate 4 is greater than the doping concentration of epitaxial layer 6. A dielectric layer 20, such as a silicon oxide layer, is then formed over the device. A first opening (not shown) is made through the dielectric layer 20 (the field oxide layer 20) by way of patterning and etching and a dielectric layer 19, the gate oxide layer 19, is grown on the epitaxial layer 6 in the first opening (not shown). A polysilicon layer 22, or other type of conductive layer, is then formed over the gate oxide layer 19 and the field oxide layer 20, for example, by deposition. A dielectric layer 24 is then deposited over the polysilicon layer 22. The dielectric layer 24 may comprise a silicon oxide or TEOS layer or may comprise several layers, such as oxide/nitride/oxide layers.

The dielectric layer 24 and the polysilicon layer 22 are then etched to provide a body opening 21 through which the body region 12 and source region 16 may be formed in the epitaxial layer 6. The etched polysilicon layer 22 forms the insulated gate region 22 of the MOSFET device.

The p-type body region 12 is then formed by implantation or diffusion of a p-type material, such as boron (B11+), in the epitaxial layer 6 through the body opening 21. Preferably, a doping dose in the range of 5e13 $cm^{-2}$ is used. The wafer is then subjected to a high temperature, for example around 1080° C., to drive the p-type body region into the epitaxial layer 6 as shown in FIG. 4.

Figure 5:
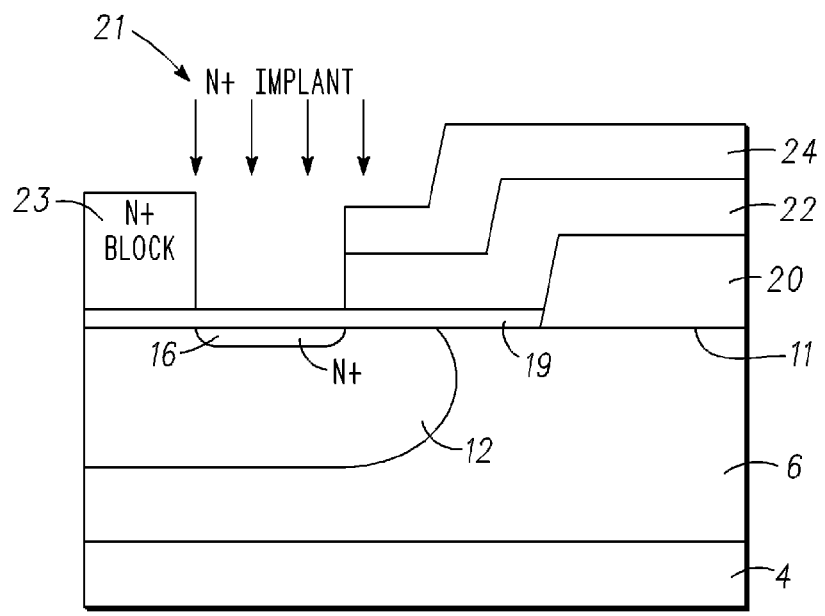

A mask 23 is formed over a portion of the dielectric layer 19 to mask off a portion of the body opening 21 as shown in FIG. 5. The source region 16 is then formed by implantation of a n-type material, such as arsenic or phosphorus, into the epitaxial layer 6. Since the source region 16 is implanted through the unmasked portion of the body opening 21 which is defined by the mask 23 and the insulated gate region 22, the source region 16, and the body region 12 are self-aligned.

Figure 6:
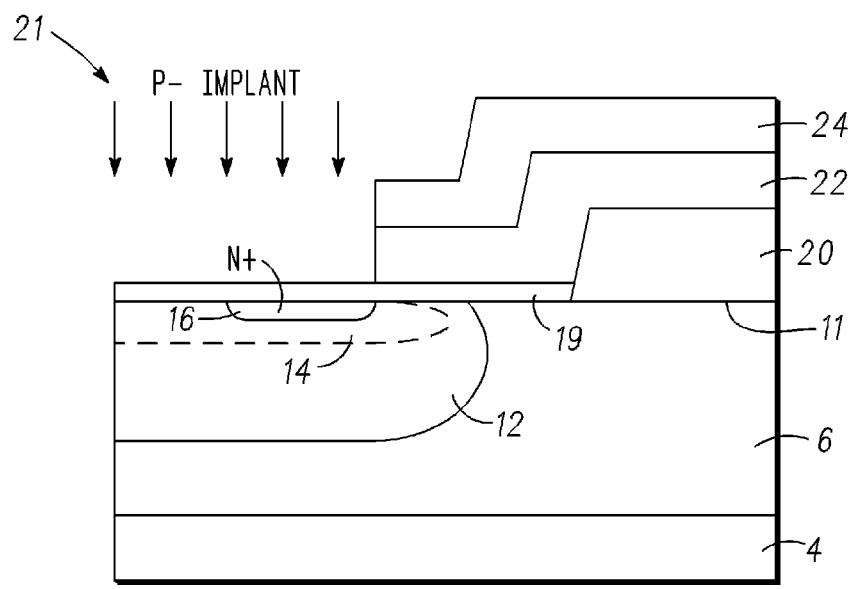

Referring now to FIG. 6, the protection region 14 is formed by a low energy (e.g. 20-60 keV) blanket implantation of a p-type material, such as boron (B11+), in the epitaxial layer 6. Preferably, a medium doping dose in the range of 1-5e13 $cm^{-2}$ is used. The doping dose of the protection region 14 must be greater than the doping dose of the body region 12 and preferably less than 1e14 $cm^{-2}$ otherwise it is difficult to control the breakdown voltage and threshold voltage. No additional mask is used for this implant step. Since the protection region 14 is implanted through the same body opening 21 as used for forming the body region 12, the protection region 14 is self-aligned to the body region 12 and the source region 16.

Figure 7:
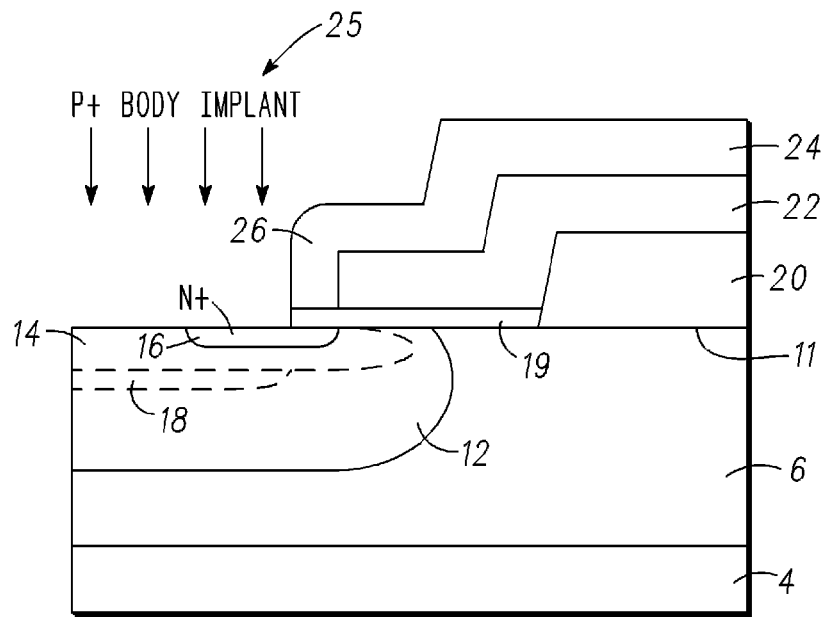

A dielectric layer (not shown), such as a TEOS layer, is formed over the dielectric layer 24 and the gate oxide layer 19. This dielectric layer (not shown) and the gate oxide layer 19 are then etched to provide a spacer 26 and an opening 25, as shown in FIG. 7, through which p-type material is implanted to form the p-type region 18. Preferably, the implant step comprises implanting a p-type material, such as born (B11+), having a doping dose of about 5e15 $cm^{-2}$.

The partly processed semiconductor device is then subjected to a low thermal operation and short drive so as to drive the source region 16, body region 12, protection region 14 and p-type region 18 into the epitaxial layer 6. For example, the semiconductor device is annealed up to a temperature of 900-950° C. for 30 minutes. Other process steps then take place including metallization wherein a metal layer 28 is formed on the dielectric layer 24 in contact with the source region 16 so as to provide the source electrode and a metal layer 30 is formed on the second surface of the substrate 4 so as to provide the drain electrode, as shown in FIG. 1. The spacer 26 isolates the metal layer 28 from the insulated gate region 22.

The doping concentrations of the p-type protection region 14 and p-type body region 12 are arranged to provide a graded doping profile, both laterally and vertically, in the channel of the MOSFET device which extends between the source region 16 and the drain. The doping profile at the junction of the source region 16, i.e. at the beginning of the channel, is increased by up to a factor of 2-3 due to the use of the protection region 14 surrounding the source region 16 and having a greater doping concentration than the doping concentration of the body region 12. The dose used for implanting the protection region 14 is close to (or substantially the same as) the dose used for implanting the body region 12 but a low thermal operation and short drive is used to drive the protection region 14 into the body region 12 compared to the high temperature p-type body drive. This results in the peak doping concentration of the protection region 14 being greater than the peak doping concentration of the body region 12.

In an alternative embodiment, the protection region 14 is formed after the high temperature step to drive the p-type body region 12 into the epitaxial layer 6 and before the source region 6 is formed.

Figure 8:
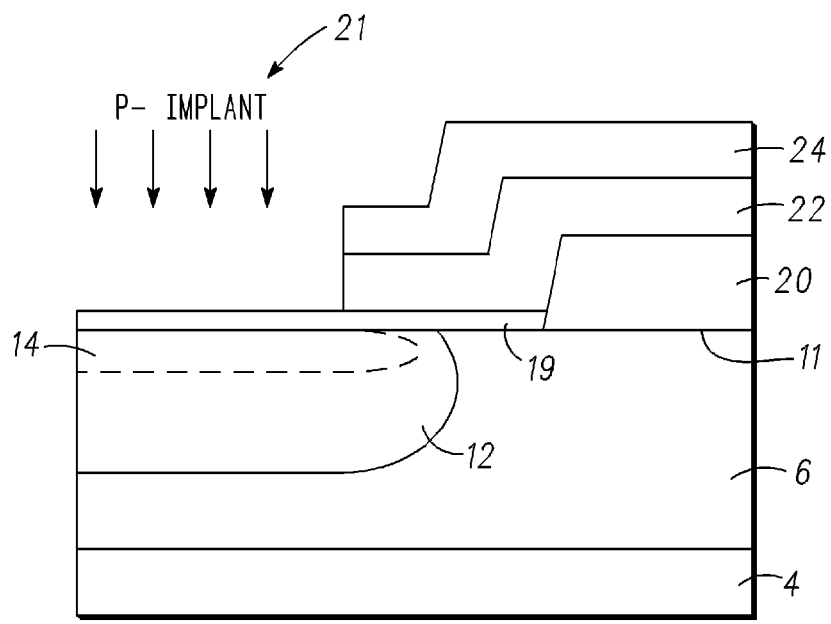
FIGS. 8-10 are schematic cross-section diagrams of the semiconductor device of FIG. 1 during different stages of fabrication in accordance with a second embodiment.

The process steps in the alternative embodiment thus follow the steps described above with reference to FIG. 4. After the high temperature p-type drive-in for the body region 12, the protection region 14 is formed by a low energy (e.g. 20-60 keV) blanket implantation of a p-type material, such as boron (B11+), in the epitaxial layer 6, as shown in FIG. 8. Preferably, a medium doping dose in the range of 1-5e13 $cm^{-2}$ is used. The doping dose of the protection region 14 must be greater than the doping dose of the body region 12 and preferably less than 1e14 $cm^{-2}$ otherwise it is difficult to control the breakdown voltage and threshold voltage. No additional mask is used for this blanket implant step but the protection region 14 is implanted through the same body opening 21 used for the body region 12 as defined by the insulated gate region 22. Thus, the protection region 14 is self-aligned to the body region 12.

Figure 9:
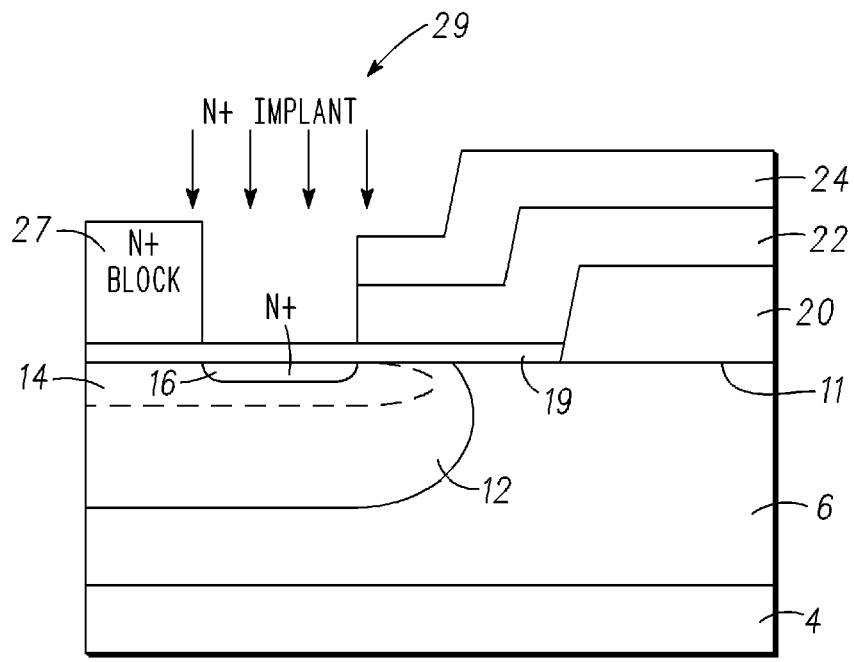

A mask 27 is formed over a portion of the dielectric layer 19 to mask off a portion of the body opening 21 to leave an unmasked portion 29 of the body opening 21 as shown in FIG. 9. The source region 16 is then formed by implantation of a n-type material, such as arsenic or phosphorus, into the protection region 14 and epitaxial layer 6. Since the source region 16 is implanted through the unmasked portion 29 of body opening 21 defined by the mask 27 and the insulated gate region 22, the source region 16, the protection region 14 and the body region 12 are all self-aligned.

Figure 10:
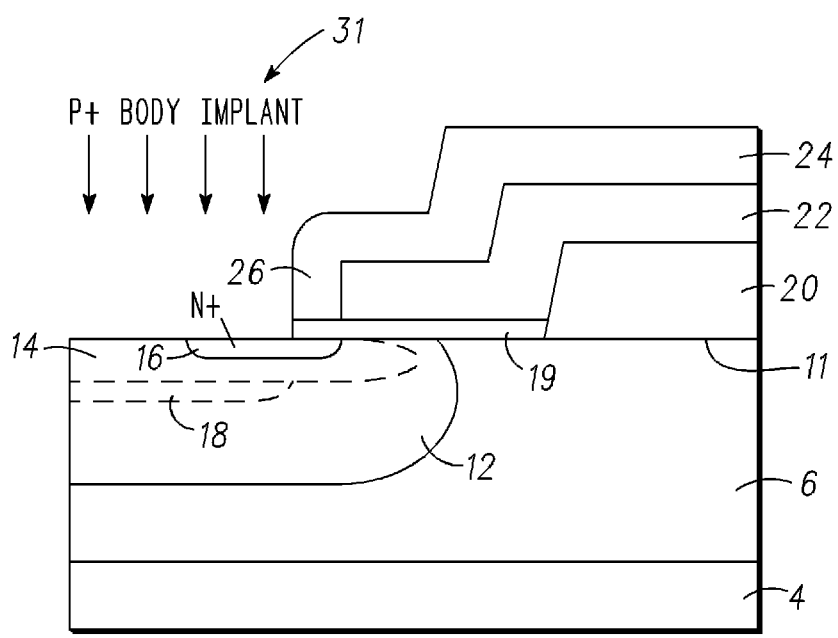

A dielectric layer (not shown), such as a TEOS layer, is formed over the dielectric layer 24 and the gate oxide layer 19. This dielectric layer (not shown) and the gate oxide layer 19 are then etched to provide a spacer 26 and an opening 25, as shown in FIG. 10, through which p-type material is implanted to form the p-type region 18. Preferably, the implant step comprises implanting a p-type material, such as born (B11+), having a doping dose of about 5e15 $cm^{-2}$.

The partly processed semiconductor device is then subjected to a low thermal operation and short drive so as to drive the source region 16, body region 12, protection region 14 and p-type region 18 into the epitaxial layer 6. For example, the semiconductor device is annealed up to a temperature of 900-950° C. for 30 minutes. Other process steps then take place including metallization wherein a metal layer 28 is formed on the dielectric layer 24 in contact with the source region 16 so as to provide the source electrode and a metal layer 30 is formed on the second surface of the substrate 4 so as to provide the drain electrode, as shown in FIG. 1. The spacer 26 isolates the metal layer 28 from the insulated gate region 22.

It will be appreciated that for both of the embodiments described above since the formation of the protection region 14 does not require any additional masks, there is no significant increase in manufacturing costs. Furthermore, since the formation of the protection region is aligned to the insulated gate region, the protection region 14 is self aligned to the body region 12 and the source region 16 which ensures that the MOSFET device operates symmetrically. This provides a device with a well characterised/controlled threshold voltage.

Figure 11:
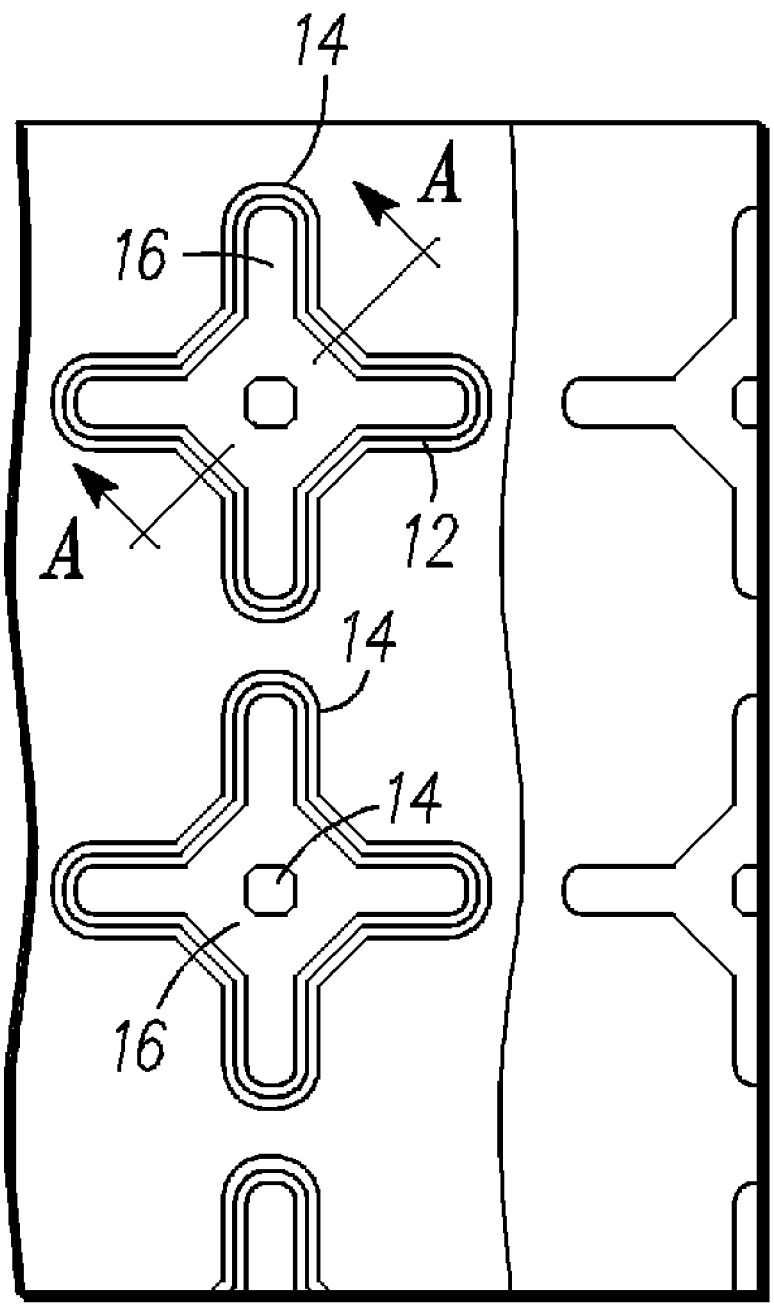
FIG. 11 is a schematic top view diagram of a part of a semiconductor device in accordance with the present invention.

It will be appreciated that a MOSFET device typically comprises a plurality of transistor base cells having different shapes, such as hexagonal cells, fingers, strips or waves. FIGS. 1-10 show a simplified cross-sectional view of only a portion of a base cell for simplicity. FIG. 11 shows a top view of a number of individual cells in accordance with the present invention which are part of a MOSFET device having a four-branch shape. More details about the four-branch shape can be found in PCT application no. WO 03/107432. FIG. 1 of this application is, for example, a cross-sectional view taken along line A-A of FIG. 11.

In summary, the present invention provides an improved semiconductor device that has a low Rdson with improved device performance while not increasing the manufacturing cost. As the size of the cells are reduced to lower Rdson, the present invention uses a protection region to surround the source region to reduce significantly the short channel effects that occur as the cell size is reduced and to improve the energy capability during UIS. Thus, as the size of the cells are reduced, the present invention reduces the degradation of the threshold voltage characteristics, suppresses the punch-through leakage current which degrades the Id-Vds characteristics, improves the trade-off between Rdson and the breakdown voltage BVdss. Furthermore, the present invention reduces the base resistance Rb of the parasitic bipolar transistor such that the ruggedness of the MOSFET device against UIS is improved.

The protection layer is formed without the need for additional mask and so does not significantly increase the fabrication cost of the MOSFET device and is self-aligned to the body region and source region to ensure uniform device operation and thus, avoids transconductance problems which will affect the operation of the device.

The invention claimed is:

1. A semiconductor device comprising:
   a semiconductor layer;
   a body region of a first conductivity type formed in the semiconductor layer and extending from a first surface of the semiconductor layer;
   a first region of a second conductivity type formed in the body region, the first region extending from the first surface of the semiconductor layer and providing a current electrode region of the semiconductor device; and
   a second region of the first conductivity type formed in the body region;
   a protection region of the first conductivity type formed in the body region and surrounding the first region, wherein the second region extends below the protection region, wherein a doping concentration of the first conductivity type in the protection region is greater than a doping concentration of the first conductivity type in the body region, and wherein the doping concentration of the first conductivity type in the protection region is greater than the doping concentration of the first conductivity type in the body region by a factor in the range of 2 to 3.

2. A semiconductor device as claimed in claim 1, wherein the doping concentration of the protection region is equal to or less than 2e18 $cm^{-3}$.

3. A semiconductor device as claimed in claim 2, wherein the first region, protection region and body region are all self-aligned.

4. A semiconductor device as claimed in claim 1, wherein the doping concentrations of the first conductivity type in the protection and body regions are selected so as to provide a graded doping profile extending away from the junction with the first region, with the doping concentration of the first conductivity type being greatest at the junction with the first region.

5. A semiconductor device as claimed in claim 4, wherein the first region, protection region and body region are all self-aligned.

6. A semiconductor device as claimed in claim 1, wherein the protection region extends from the first surface of the semiconductor layer into the body region around and underneath the first region.

7. A semiconductor device as claimed in claim 1, wherein the first region, protection region and body region are all self-aligned.

8. A semiconductor device as claimed in claim 1, wherein the semiconductor device is a MOSFET device and wherein the first region is a source region of the MOSFET device.

9. A method of forming a semiconductor device comprising:
   providing a semiconductor layer; forming a body region of a first conductivity type in the semiconductor layer, extending from a first surface of the semiconductor layer;
   forming a first region of a second conductivity type in the body region, extending from the first surface of the semiconductor layer, the first region providing a current electrode region of the semiconductor device;
   forming a second region of the first conductivity type in the body region; and
   forming a protection region of the first conductivity type in the body region extending from the first surface of the semiconductor layer, wherein the protection region surrounds the first region, and the second region extends below the protection region, wherein a doping concentration of the first conductivity type in the protection region is greater than a doping concentration of the first conductivity type in the body region and wherein the doping concentration of the first conductivity type in the protection region is greater than the doping concentration of the first conductivity type in the body region by a factor in the range of 2 to 3.

10. A method as claimed in claim 9, wherein the doping concentration of the protection region is equal to or less than 2e18 $cm^{-3}$.

11. A method as claimed in claim 10, wherein the forming a protection region step takes place before or after the forming a first region step.

12. A method as claimed in claim 10, wherein the step of forming the body region comprises providing material of the first conductivity type through a body opening into the semiconductor layer, and wherein the step of forming the protection region comprises providing material of the first conductivity type through the body opening into the body region, such that the body, and protection regions are aligned.

13. A method as claimed in claim 9, wherein the forming a protection region step takes place before or after the forming a first region step.

14. A method as claimed in claim 13, wherein the step of forming the body region comprises providing material of the first conductivity type through a body opening into the semiconductor layer, and wherein the step of forming the protection region comprises providing material of the first conductivity type through the body opening into the body region, such that the body, and protection regions are aligned.

15. A method as claimed in claim 9, wherein the forming a protection region step comprises the step of providing at a low energy in the range of 20-60 keV a material having a doping dose in the range of 1-5e13 cm$^{-2}$ of the first conductivity type into the body region.

16. A method as claimed in claim 9, wherein the step of forming the body region comprises providing material of the first conductivity type through a body opening into the semiconductor layer, and wherein the step of forming the protection region comprises providing material of the first conductivity type through the body opening into the body region, such that the body, and protection regions are aligned.

17. A method as claimed in claim 16, wherein the step of forming the first region comprises masking a portion of the body opening and providing material of the second conductivity type through the unmasked portion of the body opening into the semiconductor layer, such that the body, first and protection regions are aligned.

18. A method as claimed in claim 16, wherein the step of forming the second region comprises: forming a spacer extending over a portion of the first region from a side of the body opening to form an opening; and providing material of the first conductivity type through the opening into the body region to form the second region, such that the body, first, second and protection regions are aligned.

19. A method of forming a semiconductor device comprising:
   providing a semiconductor layer;
   forming a body region of a first conductivity type in the semiconductor layer extending from a first surface of the semiconductor layer, wherein forming the body region comprises:
      providing material of the first conductivity type into the semiconductor layer; and
      subjecting the semiconductor device to a first thermal operation to drive the body region into the semiconductor layer;
   forming a first region of a second conductivity type in the body region, extending from the first surface of the semiconductor layer, the first region providing a current electrode region of the semiconductor device;
   forming a second region of the first conductivity type in the body region; and
   forming a protection region of the first conductivity type in the body region extending from the first surface of the semiconductor layer, wherein the protection region surrounds the first region, wherein the second region extends below the protection region, and wherein a doping concentration of the first conductivity type in the protection region is greater than a doping concentration of the first conductivity type in the body region, wherein the step of forming the protection region comprises:
      providing material of the first conductivity type into the body region; and
      subjecting the semiconductor device to a second thermal operation to drive the protection region into the body region, wherein a temperature used in the second thermal operation is less than a temperature used in the first thermal operation.

20. A method of forming a semiconductor device comprising:
   providing a semiconductor layer; forming a body region of a first conductivity type in the semiconductor layer, extending from a first surface of the semiconductor layer, wherein the step of forming the body region comprises:
      providing material of the first conductivity type through a body opening into the semiconductor layer;
   forming a first region of a second conductivity type in the body region, extending from the first surface of the semiconductor layer, the first region providing a current electrode region of the semiconductor device;
   forming a second region of the first conductivity type in the body region, wherein the step of forming the second region comprises:
      forming a spacer extending over a portion of the first region from a side of the body opening to form an opening; and
      providing material of the first conductivity type through the opening into the body region to form the second region, such that the body, first, second and protection regions are aligned; and
   forming a protection region of the first conductivity type in the body region extending from the first surface of the semiconductor layer, wherein the protection region surrounds the first region, and the second region extends below the protection region, wherein a doping concentration of the first conductivity type in the protection region is greater than a doping concentration of the first conductivity type in the body region, and wherein the step of forming the protection region comprises:
      providing material of the first conductivity type through the body opening into the body region, such that the body, and protection regions are aligned.

* * * * *